US012268071B2

(12) United States Patent
Tanaka

(10) Patent No.: US 12,268,071 B2
(45) Date of Patent: *Apr. 1, 2025

(54) DISPLAY DEVICE HAVING LIGHT-EMITTING ELEMENT AND LIGHT SOURCE ELEMENT IRRADIATING ULTRAVIOLET RAYS

(71) Applicant: SHARP KABUSHIKI KAISHA, Sakai (JP)

(72) Inventor: Yuji Tanaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/031,332

(22) PCT Filed: Oct. 14, 2020

(86) PCT No.: PCT/JP2020/038706
§ 371 (c)(1),
(2) Date: Apr. 11, 2023

(87) PCT Pub. No.: WO2022/079818
PCT Pub. Date: Apr. 21, 2022

(65) Prior Publication Data
US 2023/0380236 A1 Nov. 23, 2023

(51) Int. Cl.
H10K 59/32 (2023.01)
G09G 3/3225 (2016.01)
(Continued)

(52) U.S. Cl.
CPC ........... H10K 59/32 (2023.02); G09G 3/3225 (2013.01); G09G 3/342 (2013.01); G09G 3/3426 (2013.01); H10K 50/115 (2023.02); H10K 59/38 (2023.02); G09G 2320/0626 (2013.01); G09G 2320/0686 (2013.01); G09G 2360/16 (2013.01)

(58) Field of Classification Search
CPC .... G09G 3/3426; G09G 3/3225; G09G 3/342; G09G 2320/0686; G09G 2320/0626; G09G 2360/16; G09G 3/32; G09G 3/2003; G09G 2330/021; G09G 2320/0646; G09G 2310/0251; G09G 2320/0673; G09G 2300/0819; G09G 2300/0861; G09G 2300/0842; H10K 59/38; H10K 59/32; H10K 50/115; H10K 59/70; H10K 59/875;
(Continued)

(56) References Cited

U.S. PATENT DOCUMENTS

2006/0214903 A1 9/2006 Kurosaka
2009/0001385 A1 1/2009 Skipor et al.
(Continued)

FOREIGN PATENT DOCUMENTS

CN 110646977 A 1/2020
JP 2020061369 A 4/2020
WO 2004074739 A1 9/2004

Primary Examiner — Yaron Cohen
(74) Attorney, Agent, or Firm — ScienBiziP, P.C.

(57) ABSTRACT

The present display device includes a light-emitting element including a first electrode, a second electrode, and an active layer disposed between the first electrode and the second electrode, the active layer including quantum dot light-emitting layers, and a light source element that irradiates the quantum dot light-emitting layers with ultraviolet rays.

17 Claims, 17 Drawing Sheets

(51) Int. Cl.
*G09G 3/34* (2006.01)
*H10K 50/115* (2023.01)
*H10K 59/38* (2023.01)

(58) Field of Classification Search
CPC .. H10K 59/50; G09F 9/30; G09F 9/00; H05B 33/02; H05B 33/14; G02B 5/22
See application file for complete search history.

(56) References Cited

U.S. PATENT DOCUMENTS

2018/0039103 A1* 2/2018 Jang ................ H10K 19/10
2020/0119297 A1* 4/2020 Lee ................ H10K 50/15

* cited by examiner (a)

(b)

(a)

(b)

(a)

(b)

DISPLAY DEVICE HAVING LIGHT-EMITTING ELEMENT AND LIGHT SOURCE ELEMENT IRRADIATING ULTRAVIOLET RAYS

TECHNICAL FIELD

The disclosure relates to a display device.

BACKGROUND ART

PTL 1 discloses a method of removing some of ligands bonded to a shell in a display device including a light-emitting layer containing quantum dots having a core-shell structure to enhance luminous efficiency of the quantum dots.

CITATION LIST

Patent Literature

PTL 1: JP 2020-61369 A

SUMMARY OF INVENTION

Technical Problem

The above-described method has a problem in that the forming process of the light-emitting layer is not easy, and thus another method for enhancing the luminous efficiency of the light-emitting layer is required.

Solution to Problem

A display device according to an aspect of the disclosure includes a first electrode, a second electrode, and an active layer disposed between the first electrode and the second electrode, the active layer including a quantum dot light-emitting layer, and includes a light source element that irradiates the quantum dot light-emitting layer with ultraviolet rays.

Advantageous Effects of Disclosure

According to an aspect of the disclosure, irradiating the quantum dot light-emitting layer with ultraviolet rays from the light source element allows the luminous efficiency of the quantum dot light-emitting layer to be enhanced.

DESCRIPTION OF EMBODIMENTS

Figure 1:
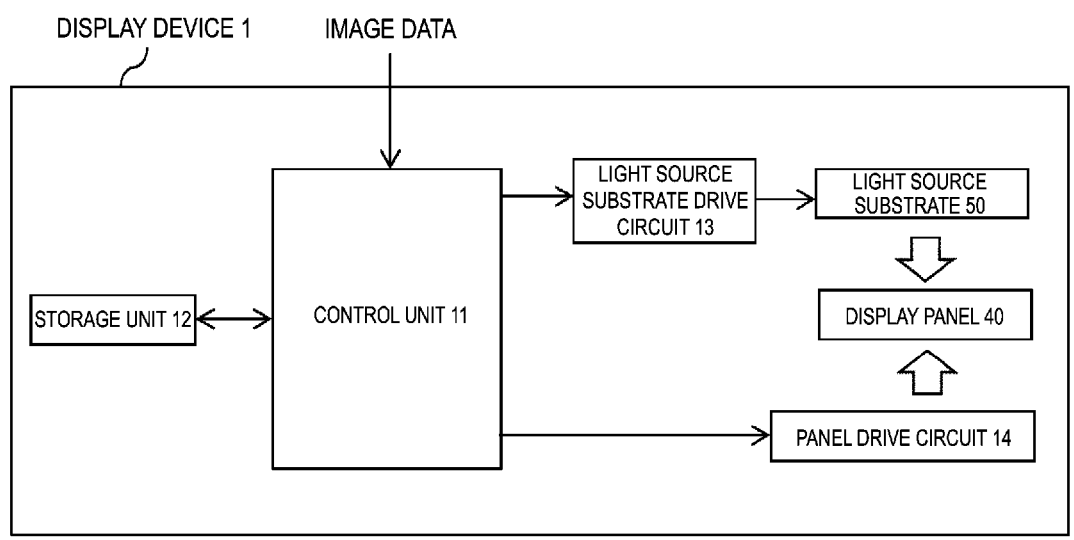
FIG. 1 is a block diagram illustrating a configuration of a display device according to the present embodiment.
Figure 2:
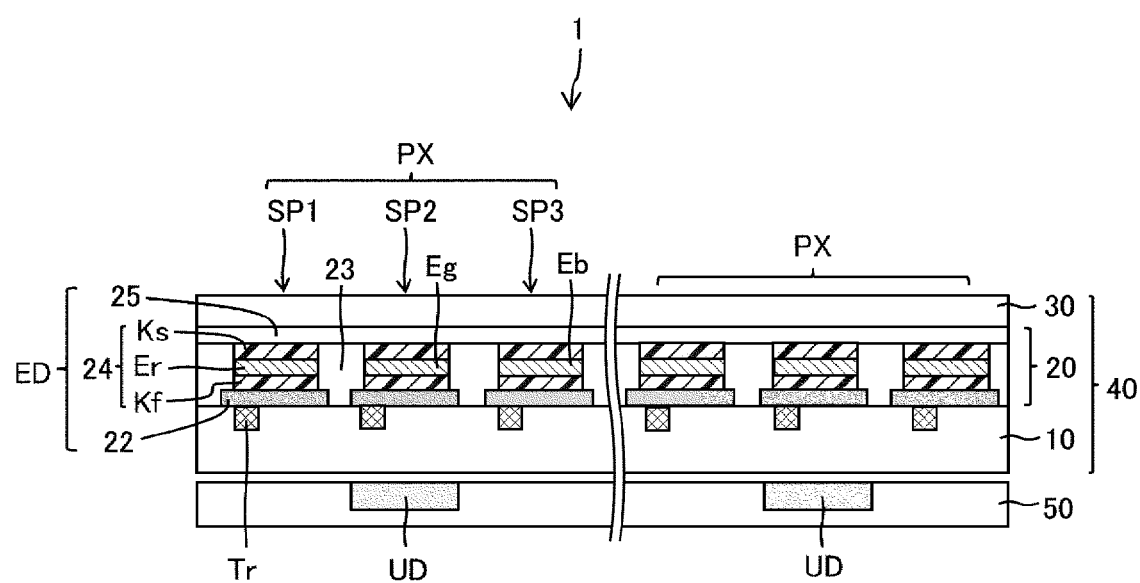
FIG. 2 is a cross-sectional view illustrating the configuration of the display device according to the present embodiment.

FIG. 1 is a block diagram illustrating a configuration of a display device according to a first embodiment. FIG. 2 is a cross-sectional view illustrating the configuration of the display device according to the first embodiment. As illustrated in FIGS. 1 and 2, the display device 1 includes a display panel 40 provided with a plurality of pixels PX, a panel drive circuit 14 that drives the display panel 40, a light source substrate 50 provided on a back face side of the display panel 40 (on the opposite side of a viewing face) and including light source elements UD that emit ultraviolet rays, a light source substrate drive circuit 13 that drives the light source substrate 50, a control unit 11 that receives image data and controls the panel drive circuit 14 and the light source substrate drive circuit 13, and a storage unit (memory) 12 connected to the control unit 11. The light source substrate 50 irradiates the display panel 40 with ultraviolet rays. The control unit 11 includes a processor.

The display panel 40 includes a TFT substrate 10 provided with a pixel circuit, and a light-emitting element layer 20 and a sealing layer 30 which are provided on the TFT substrate 10. The light-emitting element layer 20 includes lower layer electrodes 22, edge cover films 23, active layers 24, and an upper layer electrode 25. The sealing layer 30 is a layer that prevents penetration of foreign matters such as water or oxygen.

Each edge cover film 23 is an insulating film covering an edge of a respective one of the lower layer electrodes 22. Each active layer 24 includes a first electric charge function layer Kf, a quantum dot light-emitting layer Er, Eg, or Eb, and a second electric charge function layer Ks. For example, the lower layer electrode 22 may be an anode, the first electric charge function layer Kf may be a hole transport layer; the second electric charge function layer Ks may be an electron transport layer, and the upper layer electrode 25 may be a cathode.

The lower layer electrode 22, the active layer 24, and the upper layer electrode 25 constitute a light-emitting element ED. The light-emitting element ED is a quantum dot light-emitting diode (QLED) provided for each subpixel.

The display device 1 is a top emission type, in which the lower layer electrode 22 has light reflectivity, and the upper layer electrode 25 is light-transmitting.

A quantum dot light-emitting layer EM includes quantum dots that emit light having a predetermined wavelength. As the quantum dot material, a known material can be used, and examples thereof include CdSe, CdZnSe, InP, ZnSe, ZnS, ZnTe, ZnTeSe, Si, and CdS. Each quantum dot may have a core/shell structure including a core and a shell covering the core.

Examples of a material of the hole transport layer are not particularly limited as long as they are known materials, and include, for example, benzene, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; linear conjugated organic monomers, oligomers, or polymers of a polysilane-based compound, a vinylcarbazole-based compound, a thiophene-based compound, an aniline-based compound, or the like; and inorganic compounds such as nickel oxide, tungsten oxide, titanium oxide, and cesium oxide a solution of which can be used for forming a film.

Examples of a material of the electron transport layer are not particularly limited as long as they are known materials, and include organic compounds such as Alq, $Alq_3$, and BCP, and inorganic compounds (which may be in the form of nanoparticles) such as ZnO (to which Al, Mg, Li, Ga, or the like may be added), $SnO_2$, and $In_2O_3$.

Examples of a material of the lower layer electrode 22 and the upper layer electrode 25 include Al Ag, Mg, ITO, and IZO.

The display device 1 includes a subpixel SP1 that emits red light, a subpixel SP2 that emits green light, and a subpixel SP3 that emits blue light. Each of the subpixel SP1, the subpixel SP2, and the subpixel SP3 includes the light-emitting element ED. The quantum dot light-emitting layer Er of the subpixel SP1 emits red light, the quantum dot light-emitting layer Eg of the subpixel SP2 emits green light, and the quantum dot light-emitting layer Eb of the subpixel SP3 emits blue light.

Each light source element UD irradiates the light-emitting element ED (in particular, the quantum dot light-emitting layers Er, Eg, and Eb) with ultraviolet rays. The wavelength is preferably from about 350 nm to about 400 nm. The light source element UD may be provided corresponding to each subpixel, or may be provided corresponding to a plurality of the subpixels. The light source substrate drive circuit 13 may collectively control (intensity control) all the light source elements UD of the light source substrate 50, or may individually control each of the plurality of light source elements UD.

Figure 3:
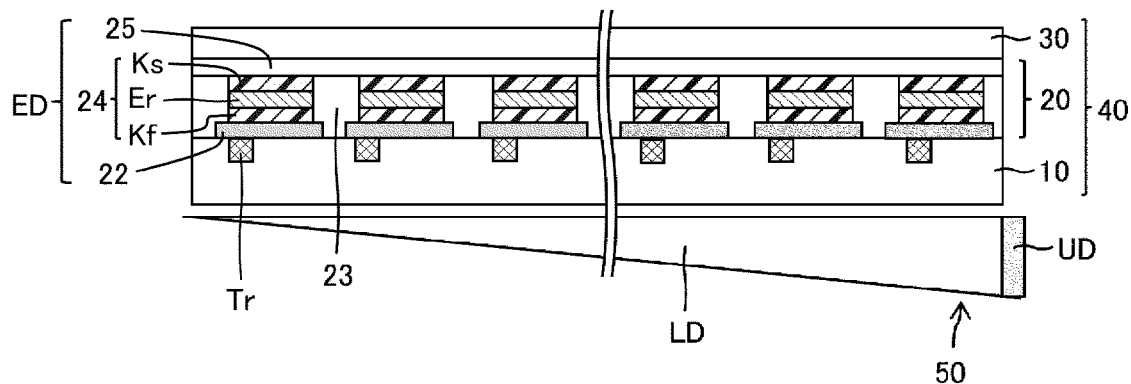
FIGS. 3(a) and (b) are cross-sectional views illustrating other configurations of the display device according to the present embodiment.
Figure 3:
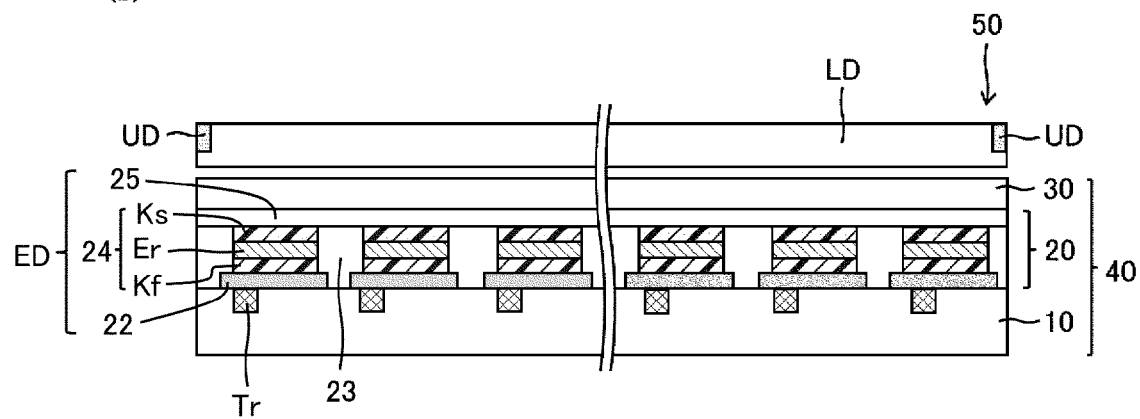

FIGS. 3(a) and (b) are cross-sectional views illustrating other configurations of the display device according to the present embodiment. The light source element UD may be disposed in a direct type so as to overlap with the display portion provided with the plurality of pixels PX as illustrated in FIG. 2, or may be disposed in an edge type so as to overlap with a non-display portion surrounding the display portion as illustrated in FIG. 3. In the case of the edge type, the light source substrate 50 is constituted by a light guide plate LD that guides ultraviolet rays to the display portion and the light source element UD provided at an edge of the light guide plate LD. The light guide plate LD may be disposed on the back face side of the display panel 40 as illustrated in FIG. 3(a), or may be disposed on a viewing face side of the display panel 40 as illustrated in FIG. 3(b).

Figure 4:
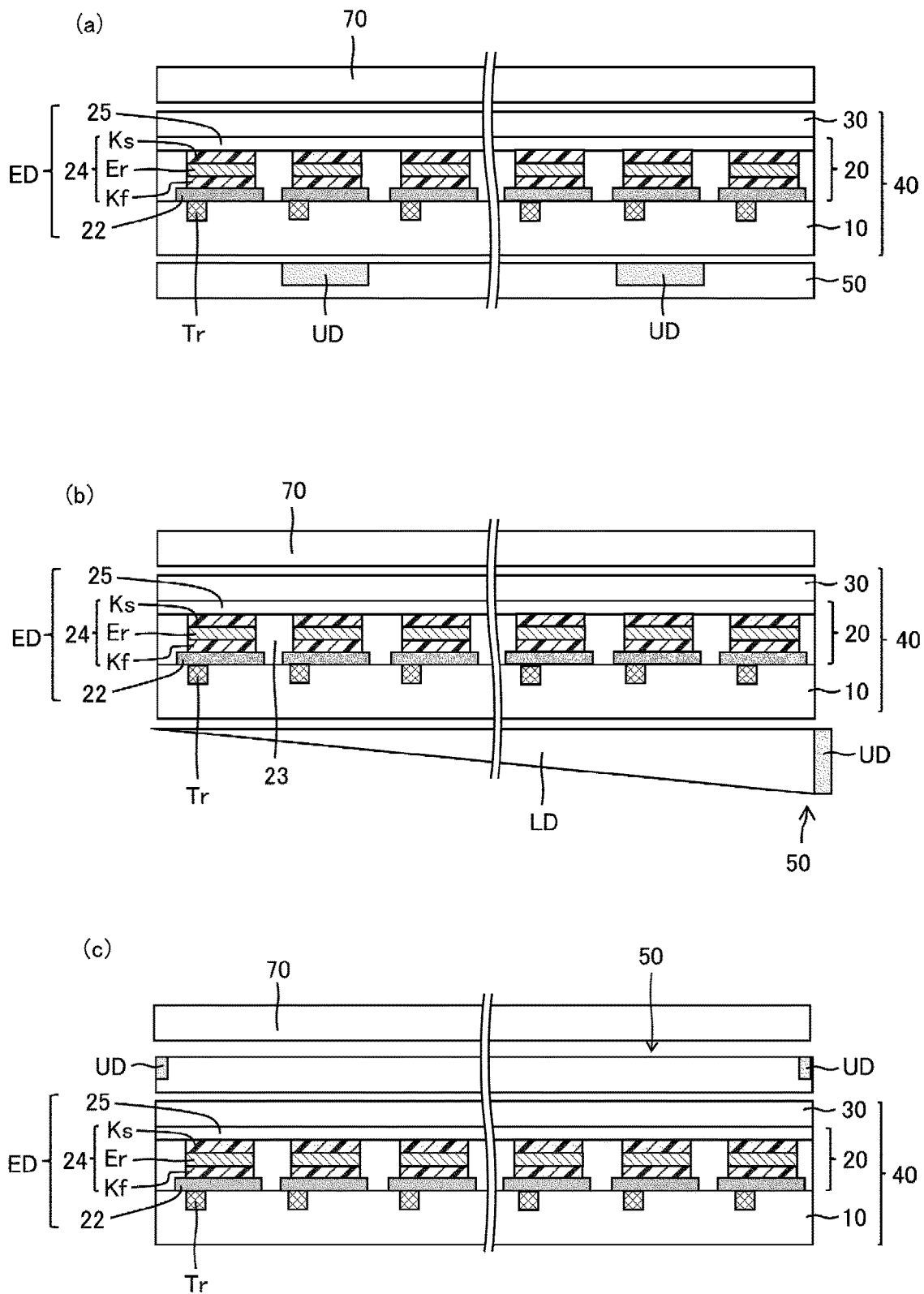
FIGS. 4(a) to (c) are cross-sectional views illustrating other configurations of the display device according to the present embodiment.

FIGS. 4(a) to (c) are cross-sectional views illustrating other configurations of the display device according to the present embodiment. In the present embodiment, as illustrated in FIGS. 4(a) and (b), in the configuration in which the light source substrate 50 is disposed on the back face side of the display panel 40, it is desirable to provide a ultraviolet cut filter 70 on the viewing face side of the display panel 40. As illustrated in FIG. 4(c), in the configuration in which the light source substrate 50 is disposed on the viewing face side of the display panel 40, it is desirable to provide the ultraviolet cut filter 70 on the viewing face side of the light source substrate 50. In this way, a viewer can be prevented from receiving ultraviolet rays. In addition, an influence of external light (ultraviolet rays) on the quantum dot light-emitting layers Er, Eg, and Eh can be reduced.

Figure 5:
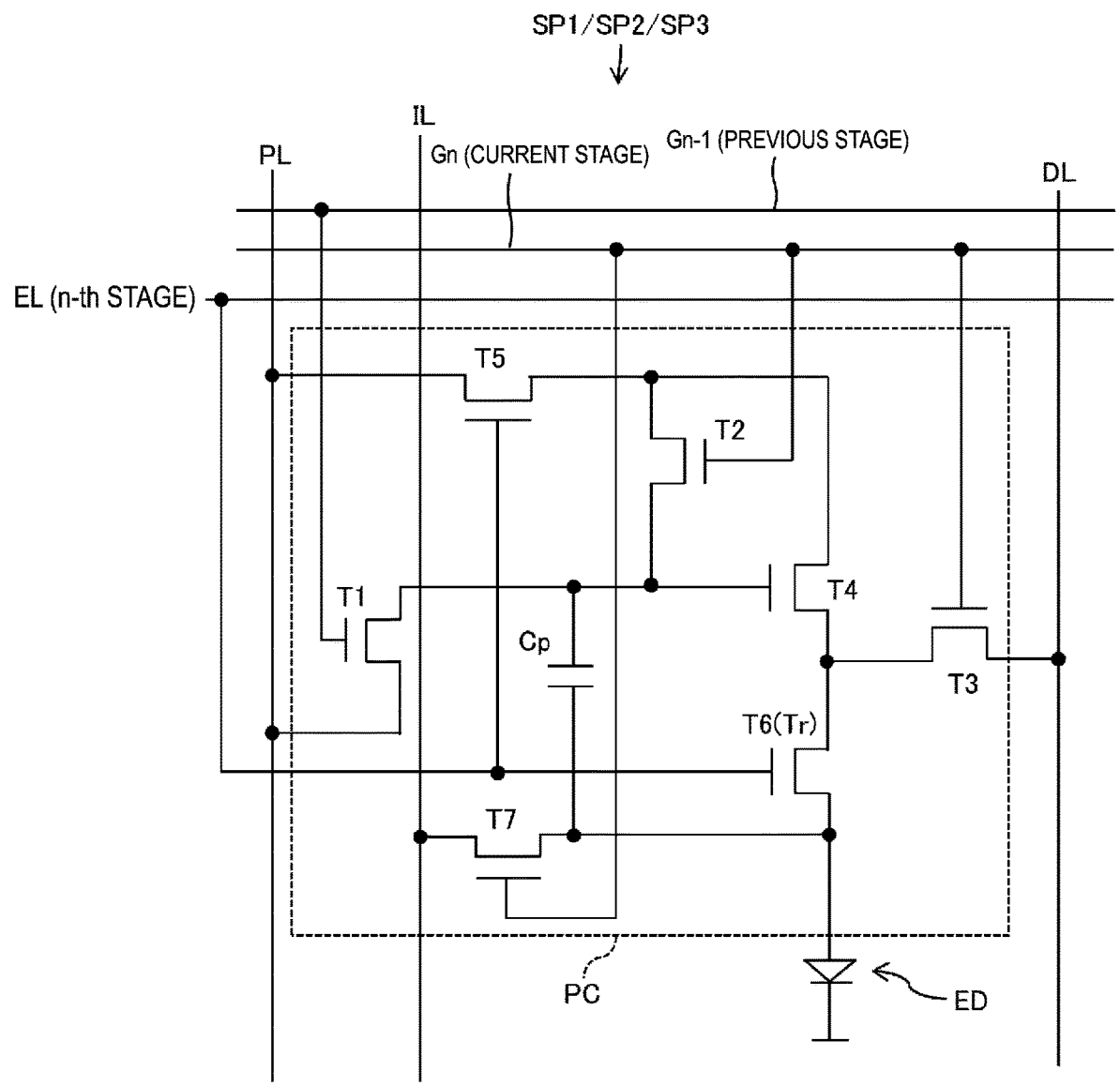
FIG. 5 is a circuit diagram illustrating a configuration example of a subpixel.

FIG. 5 is a circuit diagram illustrating a configuration example of the subpixel. Each subpixel (SP1, SP2, and SP3) includes the light-emitting element ED and a pixel circuit PC connected to the light-emitting element ED. The pixel circuit PC in FIG. 5 includes a capacitance element Cp, a reset transistor T1 including a gate terminal connected to a scanning signal line Gn-1 in a previous stage, a threshold control transistor T2 including a gate terminal connected to a scanning signal line Gn in a current stage, a writing control transistor T3 including a gate terminal connected to the scanning signal line Gn in the current stage, a drive transistor T4 that controls the current of the light-emitting element ED, a power supply transistor T5 including a gate terminal connected to a light emission control line EL, a light emission control transistor T6 including a gate terminal connected to the light emission control line EL, and an initialization transistor T7 including a gate terminal connected to the scanning signal line Gn in the current stage.

The gate terminal of the drive transistor T4 is connected to an anode of the light-emitting element ED via the capacitance element Cp, and is connected to a high-potential side power source line PL via the reset transistor T1. A high-potential side power supply (ELVDD) is supplied to the high-potential side power source line PL.

A source terminal of the drive transistor T4 is connected to a data signal line DL via the writing control transistor T3, and is connected to the anode of the light-emitting element ED via the light emission control transistor T6 (transistor Tr in FIG. 2). A drain terminal of the drive transistor T4 is connected to the gate terminal of the drive transistor 14 via the threshold control transistor 12, and is connected to the high-potential side power source line PL via the power supply transistor T5.

The anode of the light-emitting element ED is connected to an initialization signal line IL via the initialization transistor T7. A low-potential side power supply (ELVSS) is supplied to the initialization signal line IL and a cathode of the light-emitting element ED.

First Embodiment

In the first embodiment, the display panel 40 is uniformly irradiated with ultraviolet rays from the light source substrate 50. In a case where the plurality of light source elements UD are included in the light source substrate 50, the plurality of light source elements UD are collectively controlled (controlled to the same UV intensity).

Figure 6:
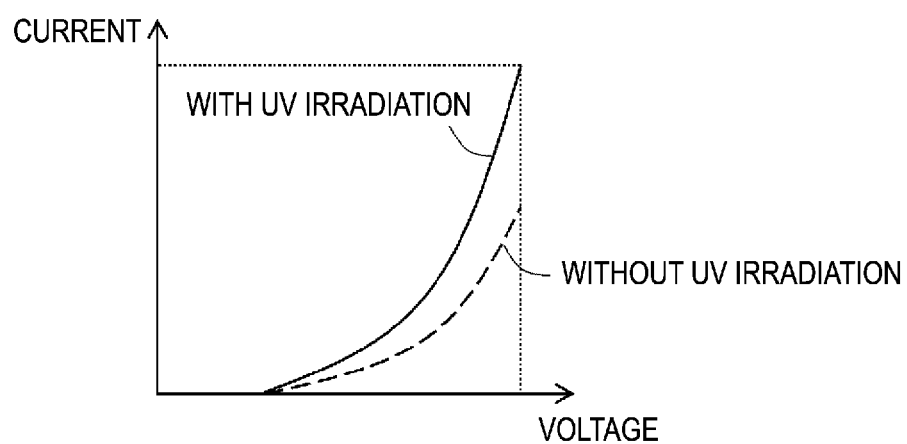
FIG. 6(a) is a graph showing current-voltage characteristics of a light-emitting element.
FIG. 6(b) is a graph showing gray scale-luminance characteristics of the light-emitting element.
Figure 6:
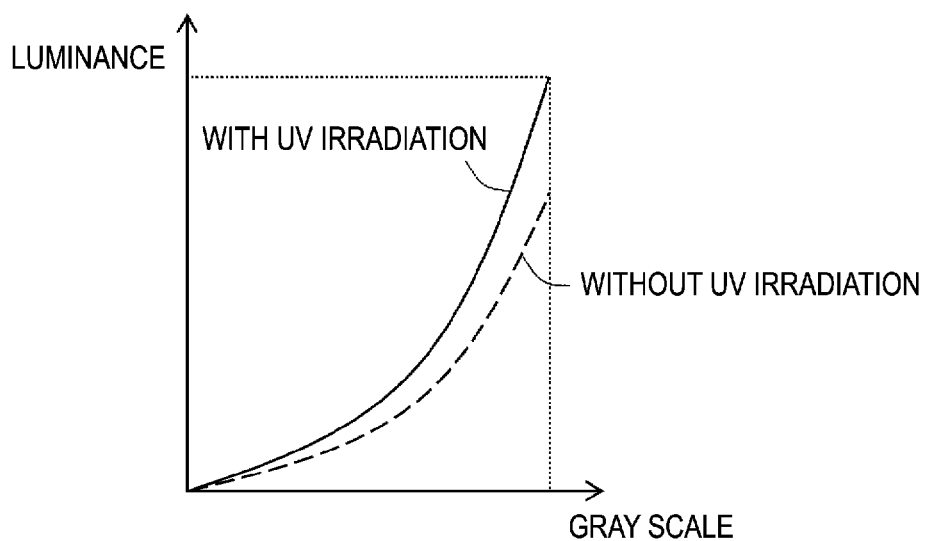

FIG. 6(a) is a graph showing current-voltage characteristics of the light-emitting element, and FIG. 6(b) is a graph showing gray scale-luminance characteristics of the light-emitting element. As shown in FIG. 6(a), the current between the anode and the cathode can be increased by ultraviolet rays irradiation without changing the voltage between the anode and the cathode. As shown in FIG. 6(b), the luminance of the light-emitting element can be increased by ultraviolet rays irradiation without changing the gray scale (data voltage). Thus, a display panel with low power consumption or a display panel with high luminance can be achieved.

Second Embodiment

Figure 7:
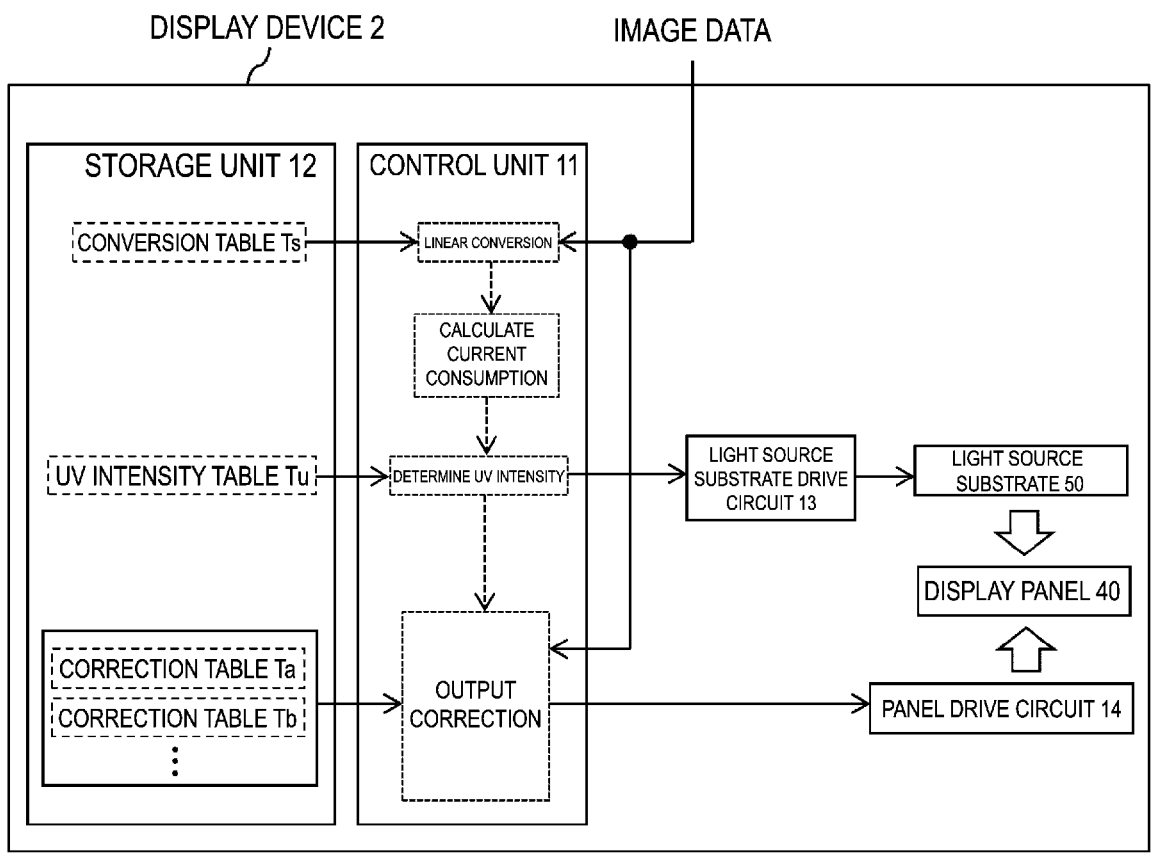
FIG. 7 is a block diagram illustrating a function of each unit of a display device according to a second embodiment. A graph shows a relationship.
Figure 8:
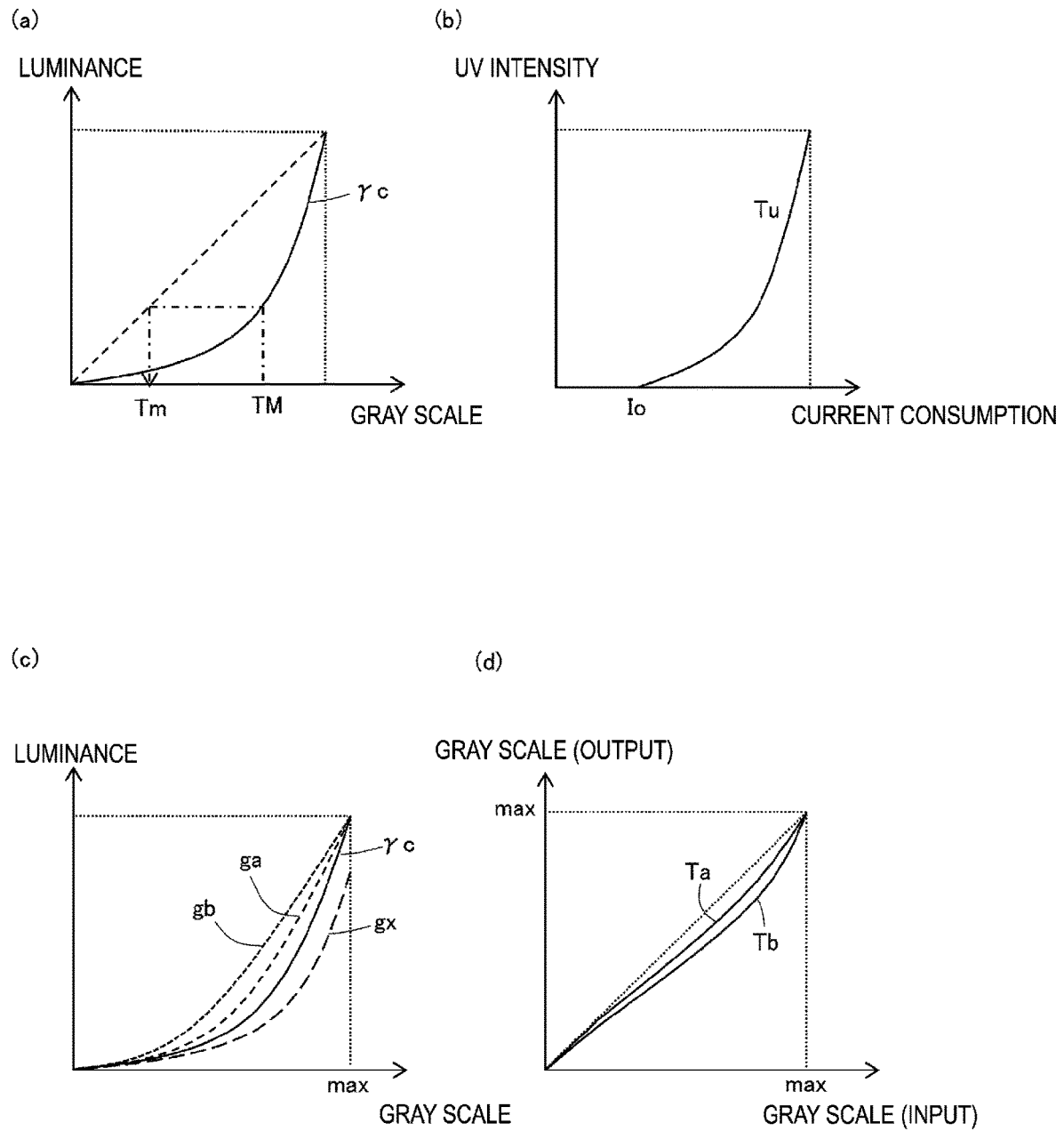
FIGS. 8(a) and (c) are graphs showing gray scale-luminance characteristics of the light-emitting element.
FIG. 8(b) is a graph showing a relationship between the current consumption and the UV intensity.
FIG. 8(d) is a graph showing a relationship between the input gray scale and the output gray scale.

In a second embodiment, the UV intensity (ultraviolet intensity) of the light source element UD is controlled in accordance with the current consumption of the entirety of the display panel 40. FIG. 7 is a block diagram illustrating a function of each unit of a display device according to the second embodiment. FIGS. 8(a) and (c) are graphs showing gray scale-luminance characteristics of a light-emitting element, FIG. 8(b) is a graph showing a relationship between the current consumption and the UV intensity in a UV intensity table, and FIG. 8(d) is a graph showing a relationship between the input gray scale and the output gray scale in a correction table.

The control unit 11 linearly converts input image data (input gray scale) by using a conversion table Ts, and calculates the current consumption in the display panel 40 based on the gray scale after the conversion. In general, a relationship between the gray scale and the luminance input to the subpixel follows a prescribed gamma curve γc shown in FIG. 8(a), and is not a linear relationship. Thus, linear conversion (for example, conversion of an input gray scale TM into a converted gray scale Tm) is performed so that a relationship between a gray scale after conversion (converted gray scale) and the luminance of the light-emitting element is linear, and the current consumption (assumed value) in the display panel 40 is calculated based on the converted gray scales of all the subpixels. Note that, since the gamma curve γc is different for each color, it is desirable to perform the linear conversion for each luminescent color (R, G, B).

Next, the control unit 11 determines the UV intensity by using the calculated current consumption (assumed value) and a UV intensity table Tu, and controls the light source substrate drive circuit 13 based on the determined LV intensity. As shown in FIG. 8(b), the UV intensity table Tu defines a relationship between the calculated current consumption (assumed value) and the UV intensity, and is set so that the UV intensity increases as the current consumption increases. Note that, in a case where the plurality of light source elements UD are included in the light source substrate 50, collective control (the same UV intensity) is performed.

In a case where the current consumption is equal to or less than a predetermined value Io, the high-potential side power supply voltage (ELVDD) is maintained, and the light-emitting element emits light with appropriate luminance (luminance according to the gamma curve yc) with respect to the input gray scale (corresponding to the gate potential of the drive transistor T4). However, when the current consumption exceeds the predetermined value Io, the high-potential side power supply voltage starts to decrease, and as shown in a graph gx in FIG. 8(c), the luminance of the light-emitting element decreases as compared with the gamma curve yc. Thus, the light source element UD is caused to emit light, the display panel 40 is irradiated with ultraviolet rays, and the current of the light-emitting element is increased.

Specifically, the control unit 11 performs output correction (a step of correcting the input gray scale to obtain the output gray scale) by using the correction table corresponding to the current consumption and the UV intensity, and controls the panel drive circuit 14 based on the output gray scale. For example, when the luminance characteristic of the light-emitting element assumed from the current consumption and the UV intensity is a graph ga in FIG. 8(c), the output correction is performed using a correction table Ta shown in FIG. 8(d). When the luminance characteristic of the light-emitting element assumed from the current consumption and the UV intensity is a graph gb in FIG. 8(c), the output correction is performed using a correction table Tb shown in FIG. 8(d). As a result, the gray scale-luminance characteristic of the light-emitting element irradiated with ultraviolet rays can be set as shown in the gamma curve γc in FIG. 8(c), and the decrease in luminance of the light-emitting element caused by the increase in the current consumption of the display panel 40 can be compensated.

Note that, from the viewpoint of reducing the power consumption of the light source substrate drive circuit 13, it is desirable that the UV intensity table Tu be set such that the luminance characteristics (graphs ga and gb) assumed by each UV intensity intersect the gamma curve γc at the maximum gray scale (max).

Further, since the gamma curve γc is different for each color as described above, it is desirable to perform the output correction for each luminescent color (R, G, B).

In the first embodiment, although the current consumption (assumed value) in the display panel 40 is calculated based on the converted gray scales of all the subpixels, the total luminance (assumed value) of the entirety of the display panel 40 may be calculated, for example.

Figure 9:
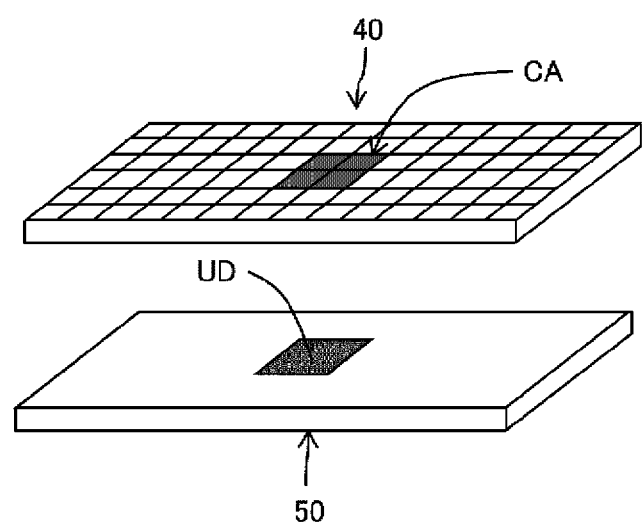
FIG. 9 is a schematic view illustrating another configuration of the display device according to the second embodiment.

FIG. 9 is a schematic view illustrating another configuration of the display device according to the second embodiment. When the current consumption of the entirety of the display panel 40 increases, the decrease in luminance of a central area CA of the display panel 40 increases. Thus, as illustrated in FIG. 9, a configuration may be such that the light source element UD that irradiates the central area CA of the display panel 40 with ultraviolet rays is disposed on the light source substrate 50, and the control unit 11 determines the UV intensity of the light source element UD by using the UV intensity table Tu that defines the relationship between an amount of decrease in luminance of the central area CA calculated from the current consumption and the UV intensity.

Third Embodiment

Figure 10:
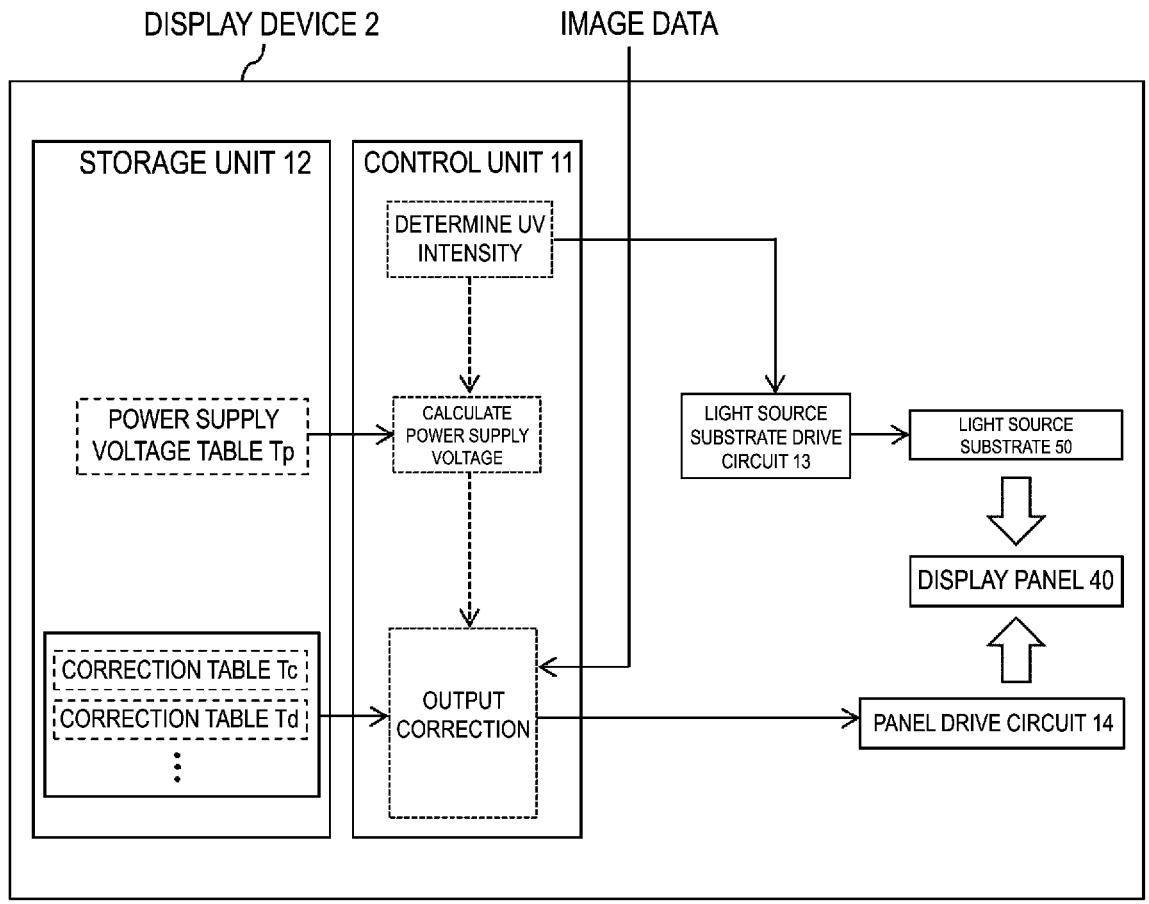
FIG. 10 is a block diagram illustrating a function of each unit of a display device according to a third embodiment.
Figure 11:
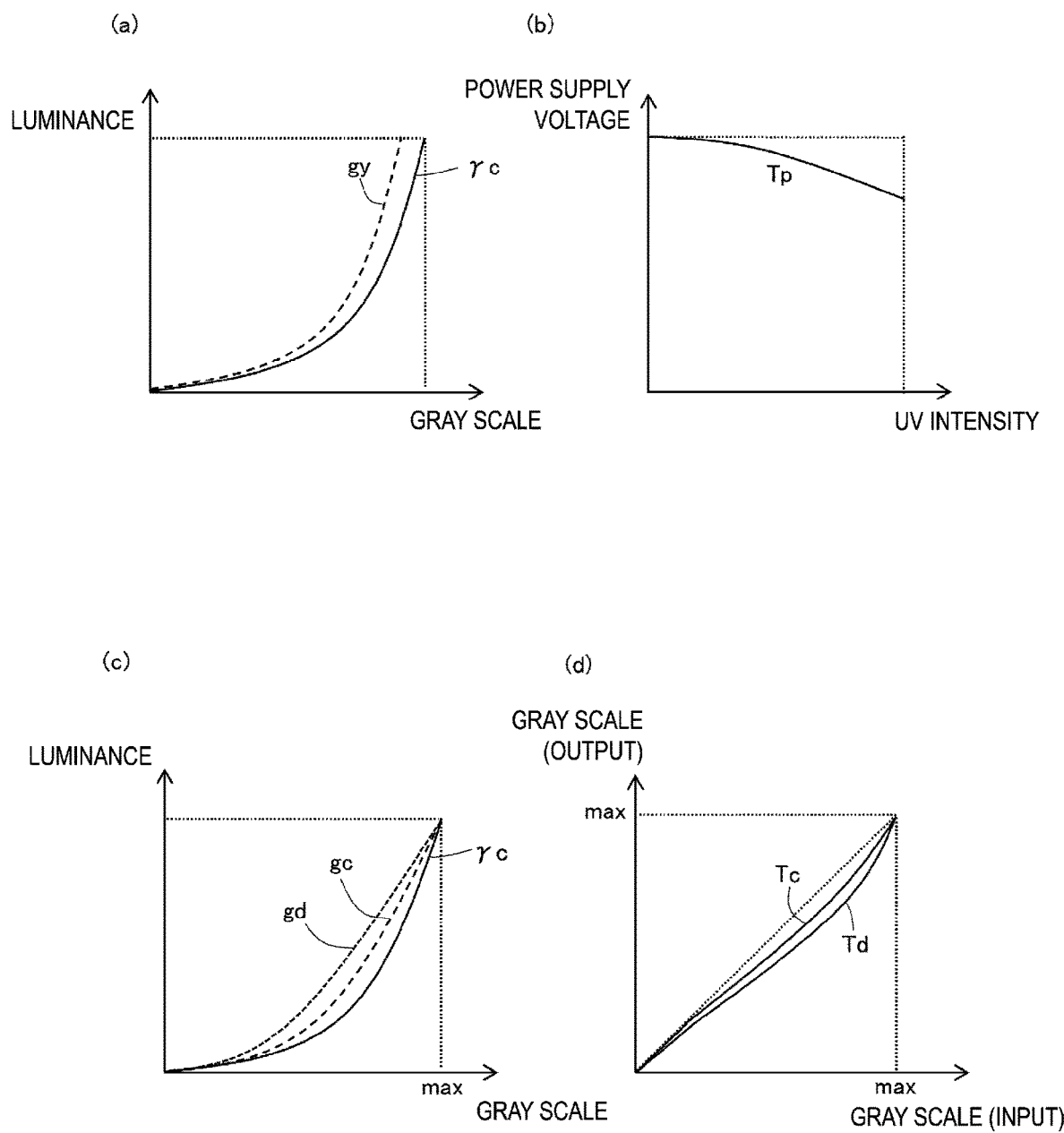
FIGS. 11(a) and (c) are graphs showing gray scale-luminance characteristics of the light-emitting element.
FIG. 11(b) is a graph showing a relationship between the UV intensity and the power supply voltage.
FIG. 11(d) is a graph showing a relationship between the input gray scale and the output gray scale.

In a third embodiment, the high-potential side power supply voltage (ELVDD) of the display panel 40 is changed according to the UV intensity. FIG. 10 is a block diagram illustrating a function of each unit of a display device according to the third embodiment. FIGS. 11(*a*) and (*c*) are graphs showing gray scale-luminance characteristics of the light-emitting element, FIG. 11(*b*) is a graph showing a relationship between the UV intensity and the power supply voltage in the UV intensity table, and FIG. 11(*d*) is a graph showing a relationship between the input gray scale and the output gray scale in the correction table.

The control unit 11 determines the UV intensity according to, for example, a user input (mode change or the like) and controls the light source substrate drive circuit 13 based on the determined UV intensity. In a case where the plurality of light source elements LTD are included in the light source substrate 50, collective control (the same UV intensity) is performed.

When the display panel 40 is irradiated with ultraviolet rays, as shown in a graph gy in FIG. 11(*a*), the luminance increases as compared with the prescribed gamma curve γc. Thus, the control unit 11 calculates the power supply voltage corresponding to the determined UV intensity by using a power supply voltage table Tp. As shown in FIG. 11(*b*), the power supply voltage table Tp defines the relationship between the UV intensity and the power supply voltage, and decreases the power supply voltage as the UV intensity increases.

The control unit 11 performs output correction (a step of correcting the input gray scale to obtain the output gray scale) by using the correction table corresponding to the UV intensity and the power supply voltage, and controls the panel drive circuit 14 based on the output gray scale. For example, when the luminance characteristic of the light-emitting element assumed from the UV intensity and the power supply voltage is a graph gc in FIG. 11(*c*), the output correction is performed using a correction table Tc shown in FIG. 11(*d*). When the luminance characteristic of the light-emitting element assumed from the UV intensity and the power supply voltage is a graph gd in FIG. 11(*c*), the output correction is performed using a correction table Td shown in FIG. 11(*d*). As a result, the actual luminance of the light-emitting element irradiated with ultraviolet rays can be set as shown in the gamma curve γc in FIG. 11(*c*) while the power consumption is reduced by lowering the power supply voltage (ELVDD).

Note that, from the viewpoint of reducing the power consumption of the light source substrate drive circuit 13, it is desirable that the power supply voltage table Tp be set such that the luminance characteristics (graphs gc and gd) assumed by each UV intensity intersect the gamma curve γc at the maximum gray scale (max).

Fourth Embodiment

Figure 12:
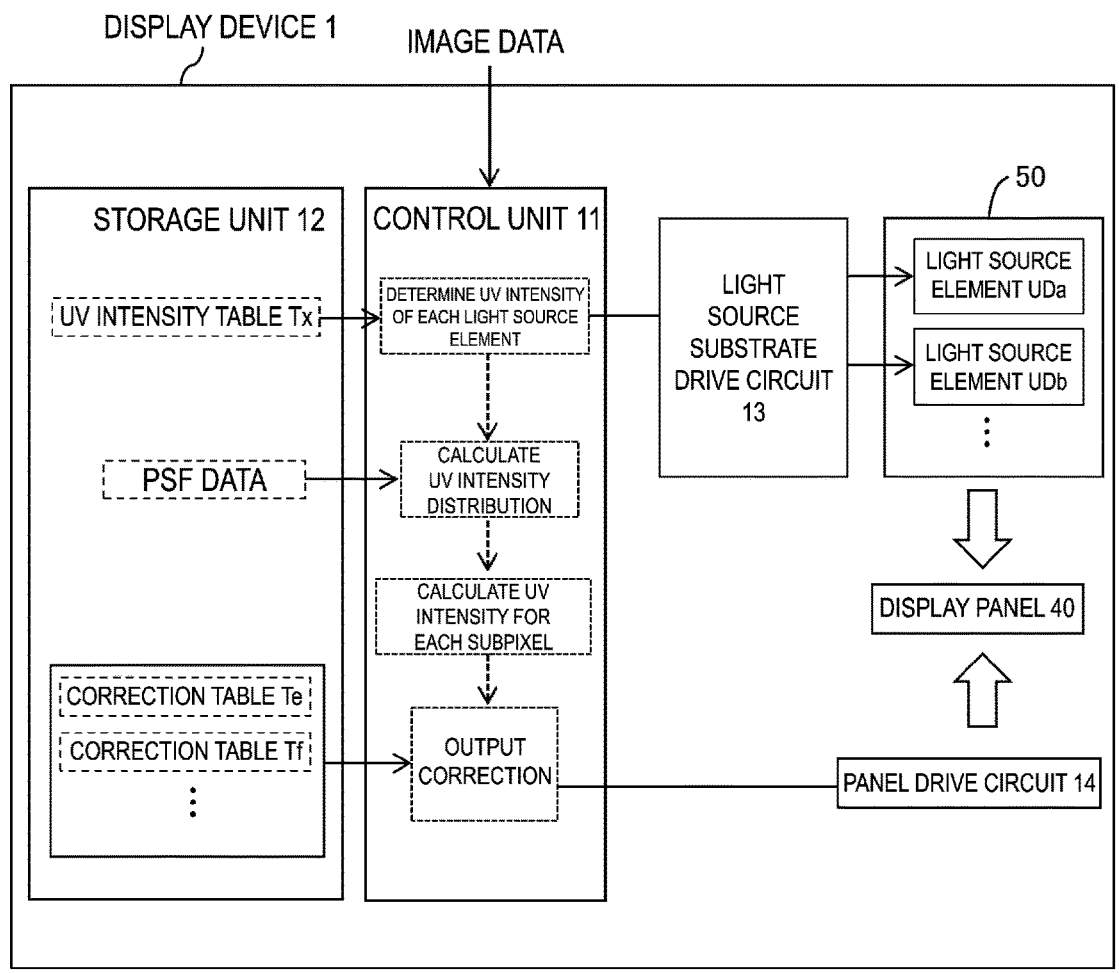
FIG. 12(a) is a block diagram illustrating a function of each unit of a display device according to a fourth embodiment.
FIG. 12(b) is a schematic view illustrating an example of the display device according to the fourth embodiment.
Figure 12:
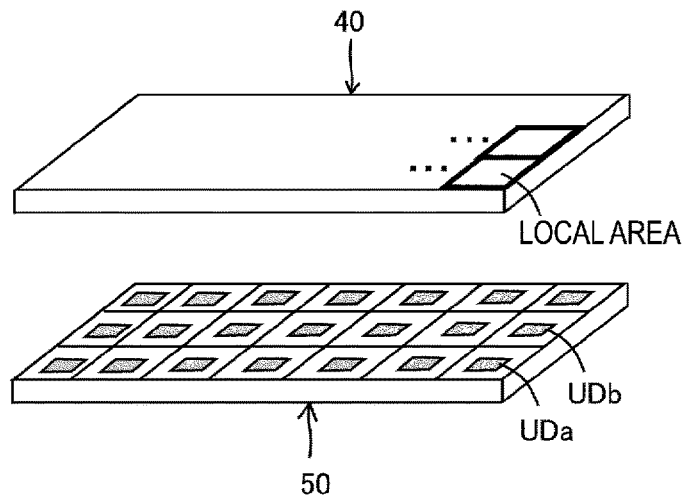
Figure 13:
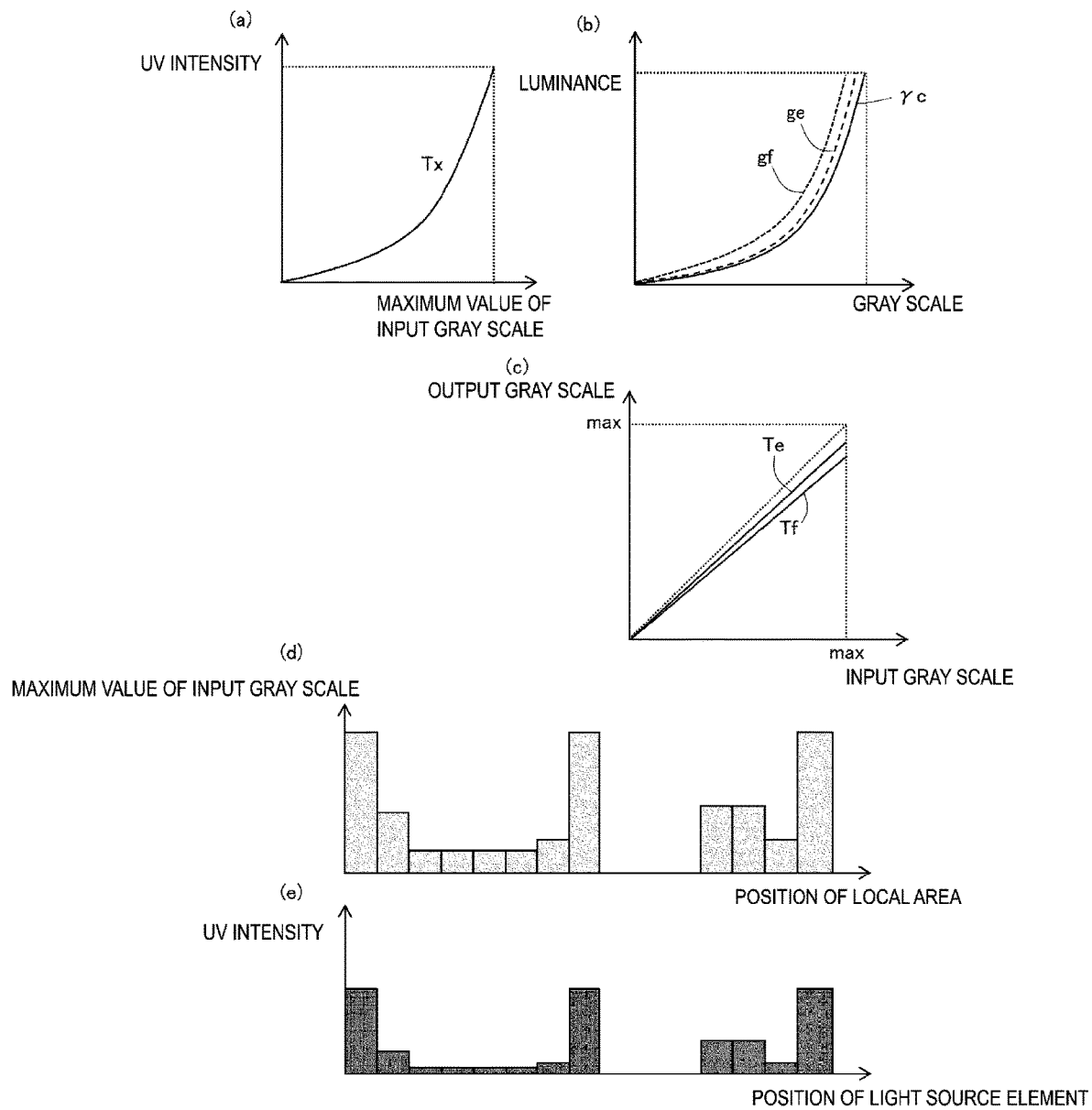
FIG. 13(a) is a graph showing a relationship between the maximum input gray scale and the UV intensity.
FIG. 13(b) is a graph showing a relationship between the gray scale and the luminance of the light-emitting element.
FIG. 13(c) is a graph showing a relationship between the input gray scale and the output gray scale.
FIG. 13(d) is an explanatory diagram showing an example of the positions of the local area and the maximum value of input gray scale.
FIG. 13(e) is an explanatory diagram showing an example of the positions of the light source element and the UV intensities.

FIG. 12(*a*) is a block diagram illustrating a function of each unit of a display device according to a fourth embodiment, and FIG. 12(*b*) is a schematic view illustrating an example of the display device according to the fourth embodiment. FIG. 13(*a*) is a graph showing a relationship between the maximum input gray scale and the UV intensity, FIG. 13(*b*) is a graph showing a relationship between the gray scale and the luminance of the light-emitting element, FIG. 13(*c*) is a graph showing a relationship between the input gray scale and the output gray scale, FIG. 13(*d*) is an explanatory diagram showing an example of the positions of the local area and the maximum value of input gray scale, and FIG. 13(*e*) is an explanatory diagram showing an example of the positions of the light source element and the UV intensities.

In the fourth embodiment, a plurality of light source elements (UDa and UDb) are provided so as to each corresponds to a respective one of a plurality of local areas (La and Lb) of the display panel 40, and individual control (local dimming) is performed for each of the plurality of light source elements.

The control unit 11 calculates the UV intensity of each light source element by using a UV intensity table Tx, and controls the light source substrate drive circuit 13 based on the determined. UV intensity. Specifically, the maximum value of the input gray scale of each of the local areas (La and Lb) corresponding to a respective one of the light source elements (UDa and UDb) is obtained from the image data, and the UV intensity corresponding to the maximum value of the input gray scale is calculated using the UV intensity table Tx.

The UV intensity table Tx defines a relationship between the maximum input gray scale and the UV intensity, and the UV intensity increases as the maximum value of the input gray scale increases. Each of the light source elements (UDa and UDb) irradiates the light-emitting element in the corresponding local area with ultraviolet rays corresponding to the determined UV intensity. For example, when the maximum value of the input gray scale of the local area La (first area) is larger than the maximum value of the input gray scale of the local area Lb (second area), the UV intensity of the light source element UDa corresponding to the local area La is made larger than the UV intensity of the light source element UDb corresponding to the local area Lb.

The control unit 11 calculates the intensity distribution (UV intensity distribution) of ultraviolet rays irradiated to the display panel 40 by using spread data (PSF data) of the ultraviolet rays of each light source element UD, and calculates the UV intensity for each subpixel from the UV intensity distribution and the position of the subpixel including the light-emitting element.

The control unit 11 performs output correction (a step of correcting the input gray scale to obtain the output gray scale) by using the correction table corresponding to the UV intensity, and controls the panel drive circuit 14 based on the output gray scale. For example, when the luminance of the light-emitting element assumed from the UV intensity for each subpixel is a graph ge in FIG. 13(*b*), the output correction is performed using a correction table Te. When the luminance of the light-emitting element assumed from the UV intensity of for each subpixel is a graph gf in FIG. 13(b), the output correction is performed using a correction table Tf. As a result, the actual luminance of the light-emitting element irradiated with ultraviolet rays can be set as shown in the gamma curve γc in FIG. 13(b).

in the fourth embodiment, the plurality of light source elements (UDa and UDb) can be individually controlled, so that the accuracy of the output correction is enhanced, allowing display with higher fidelity to the image data. Power consumption in the light source substrate 50 can be reduced. As shown in FIG. 13, increasing the UV intensity as the local area has a larger maximum value of the input gray scale allows suppression of the current of the light-emitting element (suppression of the element deterioration) or the high luminance display of the subpixel to be realized.

In the fourth embodiment, the UV intensity of the corresponding light source element is set according to the maximum gray scale of the local area, but no such limitation is intended. The input gray scale may be linearly converted, and the UV intensity may be set in accordance with the total luminance of the local area assumed from the converted gray scale.

FIG. 14(a) is a graph showing another example of the UV intensity table according to the fourth embodiment, FIG. 14(b) is an explanatory diagram showing an example of positions of the local area and the minimum value of input gray scale, and FIG. 14(c) is an explanatory diagram showing an example of the positions of the light source element and the UV intensities.

Figure 14:
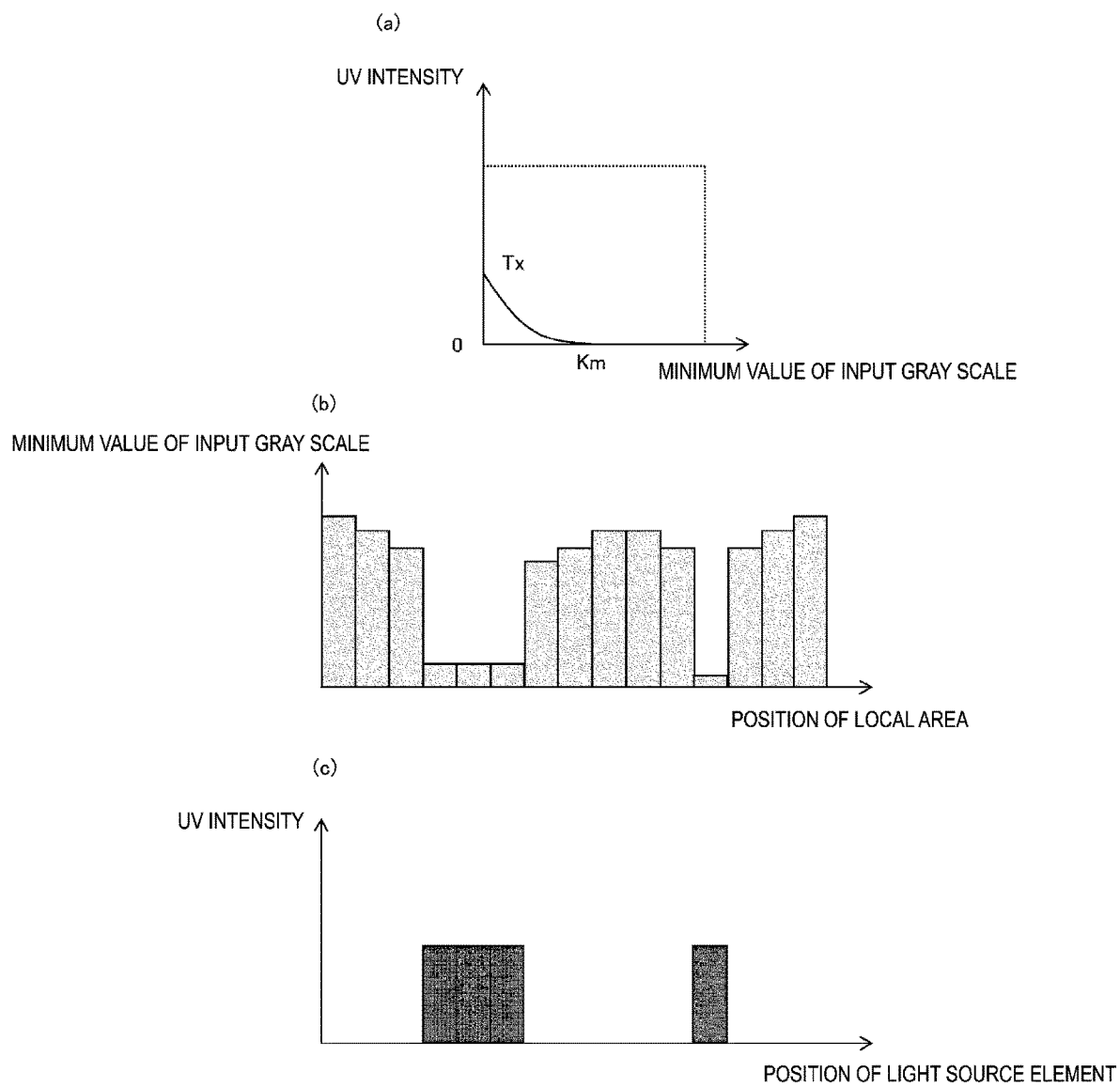
FIG. 14(a) is a graph showing another example of a UV intensity table according to the fourth embodiment.
FIG. 14(b) is an explanatory diagram showing an example of the positions of the local area and the minimum value of input gray scale.
FIG. 14(c) is an explanatory diagram showing an example of the positions of the light source element and the UV intensities.

In the configuration in FIG. 14, only a dark local area in which the minimum value of the input gray scale is equal to or smaller than a predetermined value Km is irradiated with ultraviolet rays, and the UV intensity is increased as the minimum value is smaller. For example, when the minimum value of the input gray scale of the local area La (first area) is smaller than the predetermined value Km and the minimum value of the input gray scale of the local area Lb (second area) is equal to or larger than the predetermined value Km, the light source element UDa corresponding to the local area La is caused to emit light, while the light source element UDb corresponding to the local area Lb is not caused to emit light.

A display panel using the QLED as the light-emitting element has a problem of poor gray scale reproducibility in a low gray scale region. However, irradiating the light-emitting element in the subpixel with the low input gray scale with ultraviolet, rays to enhance the luminous efficiency of the light-emitting element allows the gray scale reproducibility to be enhanced. Further, a bright local area is not irradiated with ultraviolet rays, so that power consumption can be reduced.

FIG. 15(a) is a graph showing another example of the UV intensity table according to the fourth embodiment, FIG. 15(b) is an explanatory diagram showing an example of the positions of the local area and the total luminances, and FIG. 15(c) is an explanatory diagram showing an example of the positions of the light source element and the UV intensities.

Figure 15:
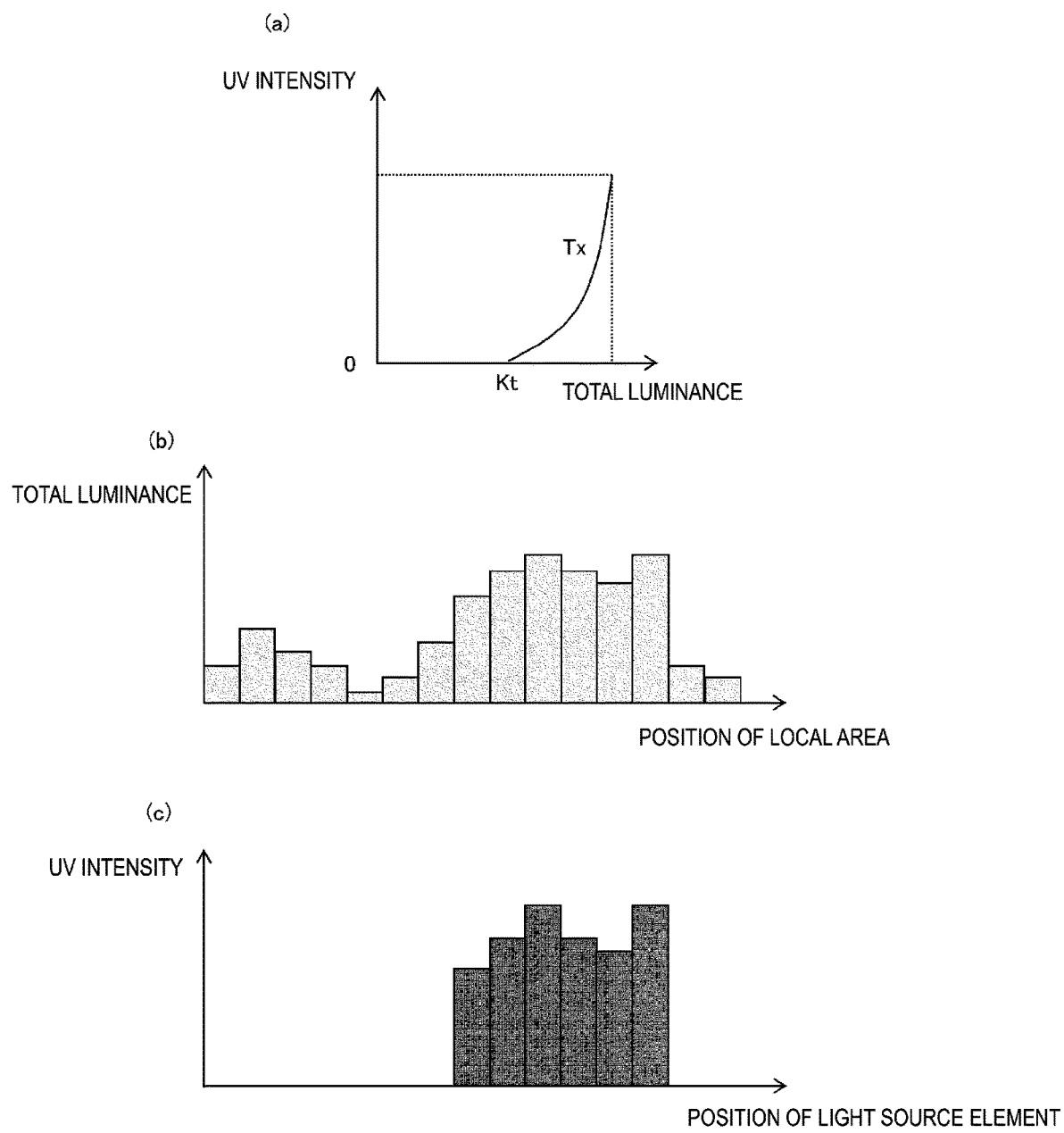
FIG. 15(a) is a graph showing another example of the UV intensity table according to the fourth embodiment.
FIG. 15(b) is an explanatory diagram showing an example of the positions of the local area and the total luminances.
FIG. 15(c) is an explanatory diagram showing an example of the positions of the light source element and the UV intensities.

In the configuration in FIG. 15, only a bright local area in which the total luminance calculated from the input gray scale is equal to or more than the threshold value Kt is irradiated with ultraviolet rays, and the UV intensity is increased as the total luminance increases. For example, when the total luminance assumed from the input gray scale of the local area La (first area) is larger than the total luminance assumed from the input gray scale of the local area Lb (second area), the UV intensity of the light source element UDa corresponding to the local area La is made larger than the UV intensity of the light source element UDb corresponding to the local area Lb.

With this configuration, the peak luminance of the display panel can be increased without changing the maximum value of the data voltage, which is suitable for displaying an HDR image, for example. Further, the dark local area is not irradiated with ultraviolet rays, so that the power consumption can be reduced.

FIG. 16(a) is a graph showing another example of the UV intensity table according to the fourth embodiment, FIG. 16(b) is an explanatory diagram showing an example of the positions of the local area and the total luminances, and FIG. 16(c) is an explanatory diagram showing an example of the positions of the light source element and the UV intensities.

Figure 16:
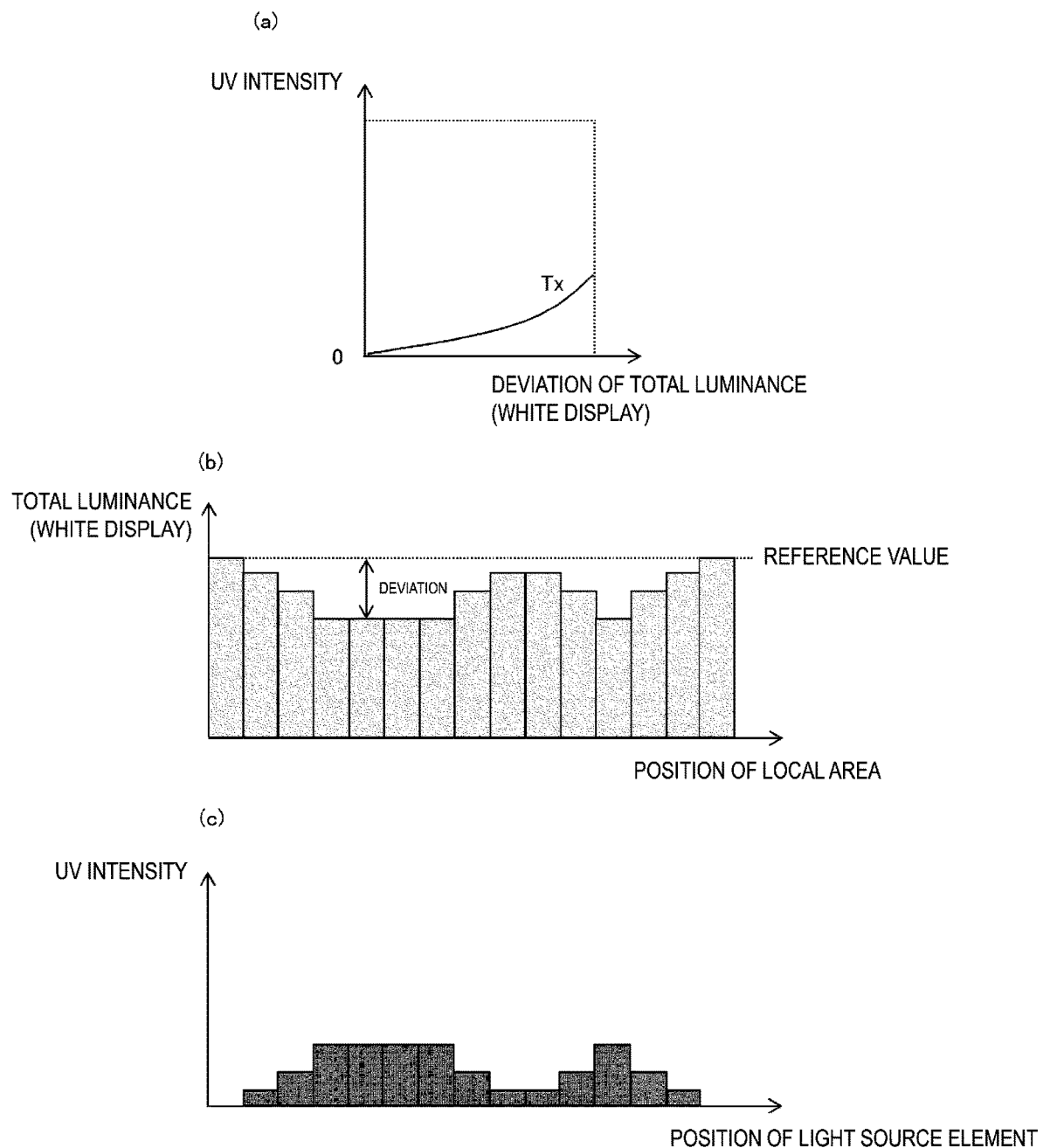
FIG. 16(a) is a graph showing another example of the UV intensity table according to the fourth embodiment.
FIG. 16(b) is an explanatory diagram showing an example of the positions of the local area and the total luminances.
FIG. 16(c) is an explanatory diagram showing an example of the positions of the light source element and the UV intensities.

In the configuration in FIG. 16, only the local area in which the total luminance at the time of ultraviolet rays non-irradiation (for example, the total luminance of white display) deviates from a reference value is irradiated with ultraviolet rays, and the UV intensity is increased as the deviation of the total luminance increases. For example, when the deviation of the total luminance of the local area La (first area) at the time of ultraviolet rays non-irradiation is larger than the deviation of the total luminance of the local area Lb (second area) at the time of ultraviolet rays non-irradiation, the UV intensity of the light source element UDa corresponding to the local area La is made larger than the UV intensity of the light source element UDb corresponding to the local area Lb.

The deviation of the total luminance can be calculated by obtaining the total luminance from the current values of the plurality of light-emitting elements in each local area (current values measured when white display is performed without irradiation of ultraviolet rays) and comparing the total luminance with the reference value. A measurement (calculation) of the deviation of the total luminance may be performed at the time of shipment or at the time of power-on or the like.

In the display panel using the QLED as the light-emitting element, luminance unevenness may occur due to characteristic variation at the time of manufacturing, aged deterioration, or the like. However, irradiating the local area with stronger ultraviolet rays as the local area has a larger deviation of the total luminance allows the deviation of the total luminance (luminance unevenness) between the local areas at the time of white display to be eliminated without changing the maximum value of the data voltage.

FIG. 17(a) is a graph showing another example of the UV intensity table according to the fourth embodiment, FIG. 17(b) is an explanatory diagram showing an example of the positions of the local area and the total luminances, and FIG. 17(c) is an explanatory diagram showing an example of the positions of the light source element and the UV intensities.

Figure 17:
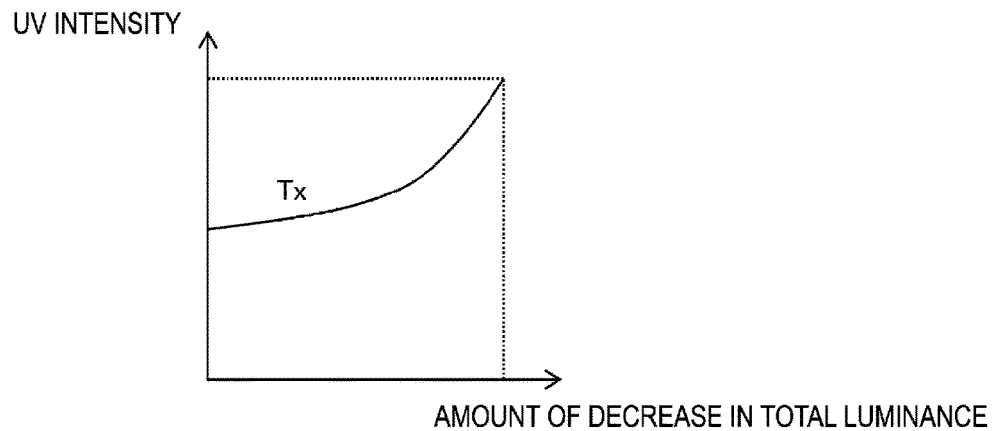
FIG. 17(a) is a graph showing another example of the UV intensity table according to the fourth embodiment.
FIG. 17(b) is an explanatory diagram showing an example of the positions of the local area and the total luminances.
FIG. 17(c) is an explanatory diagram showing an example of the positions of the light source element and the UV intensities.
Figure 17:
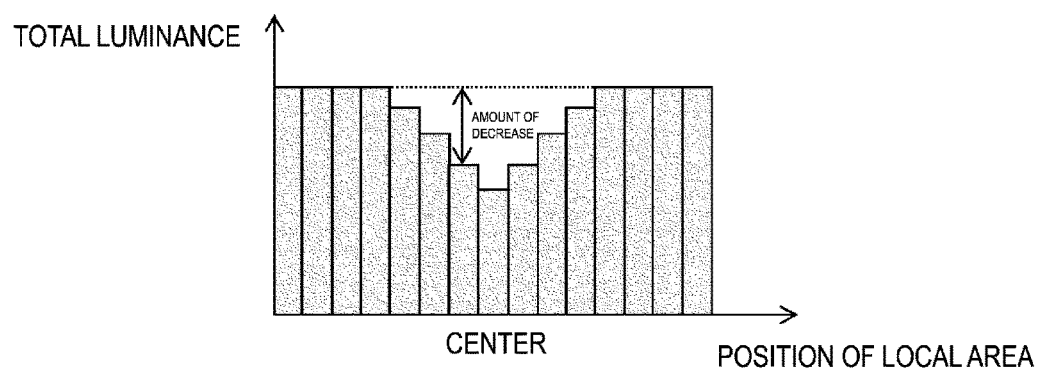
Figure 17:
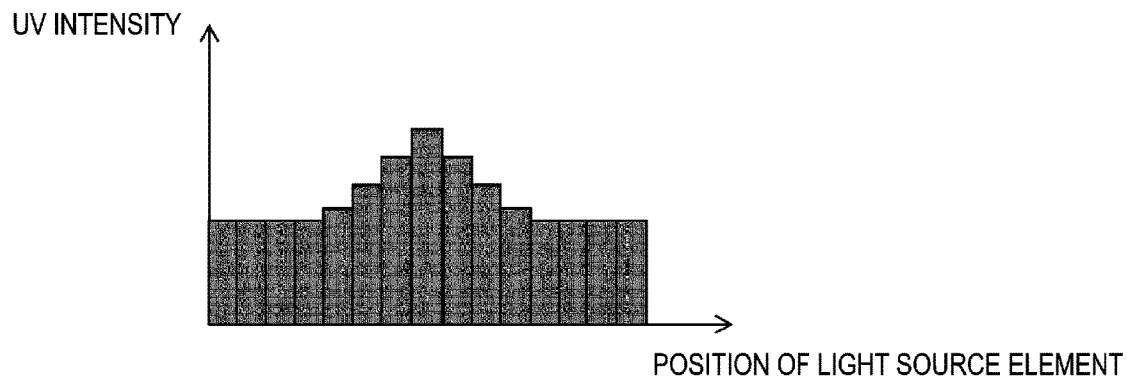

In FIG. 17, the current consumption of the entirety of the display panel is calculated based on the input gray scale of the entirety of the display panel, the amount of decrease (assumed value) in the total luminance of the local area is calculated from the current consumption and the positions of the local area, and the UV intensity of the light source element is increased as the amount of decrease in the total luminance increases. For example, when the amount of decrease in the total luminance of the local area La (first area) is larger than the amount of decrease in the total luminance of the local area Lb (second area), the UV intensity of the light source element UDa corresponding to the local area La is made larger than the UV intensity of the light source element UDb corresponding to the local area Lb.

As shown in FIG. 17(b), the closer to the center of the display panel, the more the decrease in luminance (decrease from the luminance corresponding to the input gray scale), but irradiating the local area with stronger ultraviolet rays as the local area has a larger decrease in luminance (closer to the center) allows the decrease in luminance in the local area located near the center of the display panel to be eliminated without changing the maximum value of the data voltage.

The embodiments described above are for the purpose of illustration and description and are not intended to be limiting. It will be apparent to those skilled in the art that many variations will be possible in accordance with these examples and descriptions.

The invention claimed is:

1. A display device comprising:
a light-emitting element including
a first electrode,
a second electrode, and
an active layer disposed between the first electrode and the second electrode, the active layer including a quantum dot light-emitting layer;
a light source element configured to irradiate the quantum dot light-emitting layer with ultraviolet rays; and
a display panel including a plurality of pixels,
wherein each of the plurality of pixels includes a plurality of subpixels,
each of the plurality of subpixels includes the light-emitting element, and
an ultraviolet intensity of the light source element, when an input gray scale of the plurality of subpixels is a first input gray scale lower than a predetermined gray scale, is larger than an ultraviolet intensity of the light source element when the input gray scale of the plurality of subpixels is a second input gray scale equal to or higher than the predetermined gray scale.

2. The display device according to claim 1,
wherein the light source element is provided corresponding to each of the plurality of pixels.

3. The display device according to claim 1,
wherein the light source element is provided corresponding to the plurality of pixels.

4. The display device according to claim 1,
wherein the ultraviolet intensity of the light source element is set in accordance with current consumption of entirety of the display panel.

5. The display device according to claim 1,
wherein a value of a power supply voltage supplied to the plurality of subpixels is set in accordance with the ultraviolet intensity of the light source element.

6. The display device according to claim 1,
wherein the display panel further includes a plurality of local areas,
each of the plurality of local areas includes each of the plurality of subpixels, and
the light source element is provided corresponding to each of the plurality of local areas.

7. The display device according to claim 1, further comprising an ultraviolet cut filter on a viewing side of the display panel.

8. The display device according to claim 1,
wherein the active layer further includes an electron transport layer and a hole transport layer.

9. The display device according to claim 1,
wherein a current value of the light-emitting element with respect to a same voltage is increased by irradiation of the ultraviolet rays.

10. The display device according to claim 1,
wherein the light source element is provided on a back face side of the display panel.

11. The display device according to claim 1,
wherein the light source element is provided on a viewing face side of the display panel.

12. A display device comprising:
a light-emitting element including
a first electrode,
a second electrode, and
an active layer disposed between the first electrode and the second electrode, the active layer including a quantum dot light-emitting layer;
a light source element configured to irradiate the quantum dot light-emitting layer with ultraviolet rays;
a display panel including a plurality of pixels and a plurality of local areas; and
a controller configured to control an ultraviolet intensity of the light source element,
wherein each of the plurality of pixels includes a plurality of subpixels,
each of the plurality of subpixels includes the light-emitting element,
each of the plurality of local areas includes each of the plurality of subpixels,
the light source element is provided corresponding to each of the plurality of local areas,
the plurality of local areas further includes a first area and a second area, and
the controller controls the ultraviolet intensity of the light source element such that, when a maximum value of an input gray scale of the first area is larger than a maximum value of an input gray scale of the second area, a first ultraviolet intensity of the light source element corresponding to the first area is made larger than a second ultraviolet intensity of the light source element corresponding to the second area.

13. The display device according to claim 12,
wherein a total luminance assumed from the input gray scale of the first area is larger than a total luminance assumed from the input gray scale of the second area.

14. The display device according to claim 12,
wherein a deviation between a total luminance of the first area, at a time of non-irradiation of the ultraviolet rays, and a reference value is larger than a deviation between a total luminance of the second area, at the time of non-irradiation of the ultraviolet rays, and the reference value.

15. The display device according to claim 12,
wherein a minimum value of the input gray scale of the first area is smaller than a predetermined gray scale, and a minimum value of the input gray scale of the second area is equal to or larger than the predetermined gray scale.

16. The display device according to claim 12,
wherein an amount of decrease in luminance of the first area, assumed from an input gray scale of entirety of the display panel and a position of the first area, is larger than an amount of decrease in luminance of the second area, assumed from the input gray scale of the entirety of the display panel and a position of the second area.

17. The display device according to claim 12,
wherein the first area is closer to a center of the display panel than the second area.

* * * * *